United States Patent
Tzu et al.

[11] Patent Number: 5,783,337
[45] Date of Patent: Jul. 21, 1998

[54] PROCESS TO FABRICATE A DOUBLE LAYER ATTENUATED PHASE SHIFT MASK (APSM) WITH CHROME BORDER

[75] Inventors: San-De Tzu, Taipei; Chih-Chiang Tu, Tauyan; Wen-Hong Huang, Hsin-Chu; Chia-Hui Lin, Hsin-Chu, all of Taiwan

[73] Assignee: Taiwan Semiconductor Manufacturing Company, Ltd., Hsin-Chu, Taiwan

[21] Appl. No.: 856,786

[22] Filed: May 15, 1997

[51] Int. Cl.$^6$ .................................................. G03F 9/00
[52] U.S. Cl. .................................................. 430/5; 430/296
[58] Field of Search ........................... 430/5, 296, 322, 430/323, 324

[56] References Cited

U.S. PATENT DOCUMENTS

| | | | |
|---|---|---|---|
| 5,334,282 | 8/1994 | Nakayama et al. | 430/5 |
| 5,474,864 | 12/1995 | Isao et al. | 430/5 |
| 5,480,747 | 1/1996 | Vasuder | 430/5 |
| 5,503,951 | 4/1996 | Flanders et al. | 430/5 |
| 5,565,286 | 10/1996 | Lin | 430/5 |

*Primary Examiner*—S. Rosasco
*Attorney, Agent, or Firm*—George O. Saile; Stephen B. Ackerman; Rosemary L. S. Pike

[57] ABSTRACT

A new process for fabricating an attenuated phase-shifting photomask is described. A photomask blank is provided comprising a phase-shifting layer overlying a substrate, a chromium layer overlying the phase-shifting layer, and a resist layer overlying the chromium layer. The resist layer of the photomask blank is exposed to electron-beam energy wherein a main pattern area of the photomask blank is exposed to a first dosage of the electron-beam energy and wherein a border area surrounding the main pattern area is not exposed to the electron-beam energy and wherein a secondary pattern area between the main pattern area and the border area is exposed to a second dosage of electron-beam energy wherein the second dosage is lower than the first dosage. The exposed resist layer is developed wherein the resist within the main pattern area is removed to expose the chromium layer. The exposed chromium layer is etched through to expose the underlying phase-shifting layer. The exposed phase-shifting layer is etched through to expose the substrate. The resist overlying the chromium layer within the secondary pattern area is etched away. The chromium layer within the secondary pattern area is etched away. The resist within the border area is stripped away to leave a patterned phase-shifting layer in the main pattern area and a chromium layer in the border area to complete fabrication of the attenuated phase-shifting photomask.

22 Claims, 6 Drawing Sheets

PROCESS TO FABRICATE A DOUBLE LAYER ATTENUATED PHASE SHIFT MASK (APSM) WITH CHROME BORDER

BACKGROUND OF THE INVENTION (1) Field of the Invention

The invention relates to a process for fabricating a photomask, and more particularly, to a process for fabricating an attenuated phase-shifting photomask.

(2) Description of the Prior Art

As photolithography advances to 0.35 microns and below, new technologies are required to increase resolution of the imaging lens. One new technology is the use of attenuated phase-shifting photomasks. Phase shift masks take advantage of the interference effect in a coherent or partially coherent imaging system to reduce the spatial frequency of a given object, to enhance its edge contrast, or both. It is possible to control locally the type of interference, destructive or constructive, at critical locations in a design by adding an additional patterned layer of transmitting material on the mask. This technique results in a combination of higher resolution, larger exposure latitude, and larger depth-of-focus. In phase shift lithography, a transparent coating is placed over a transparent area. The light waves passing through the coated region are delayed 180° out of phase with the light waves passing through the uncoated region. At the edge of a phase-shifted area, the light waves from the phase-shifted and clear areas will cancel out producing a more sharply defined interface.

An attenuated phase shifting mask (APSM) includes an attenuator which is a metallic-like light absorbing film such as molybdenum silicide oxynitride (MoSiON) or chromium oxynitride (CrON) which allows 5–15% light transmittance. The partial transmittance of the light waves through the attenuator allows for phase shifted light to be produced. APSM is one of the most popular phase shifting mask techniques and one of the easiest methods because of the ease of mask fabrication. The major drawback of the APSM technique is the secondary lobe peak intensity. The transmittance of light through a APSM at the opaque pattern areas is about 8% in the 0.35 micron design rule of i-line technology. FIG. 1A illustrates a pattern area 32. Light leakage 34 is seen at the edges of the pattern areas. FIG. 1B illustrates a wafer 30 and a portion of a set 36 of pattern areas. FIG. 1C is an enlarged view of set 36 in FIG. 1B. Pattern set 36 consists of adjacent pattern areas 32. Each pattern area 32 has a zone of light leakage around its edges. Light leakage 38 is twofold at the overlapping edges of the pattern areas or fourfold at the corners 40 of the image field.

The exposure dosage of the light leakage at the border area will be greater than the threshold energy of the photoresist, causing a ghost image to appear at the corner of each image field. The most popular way to resolve this light leakage problem is to add sub-resolution contact holes on the mask border area which cannot be resolved by the exposure system. The light will be scattered by the sub-resolution contact holes in the border area (if the size of the contact holes is controlled very well); therefore the light intensity will be reduced to a small quantity that will not influence the resist layer. There are drawbacks to this approach. It is time consuming to form the sub-resolution contact holes at the border area, requiring E-beam exposure to be performed twice, once for the main pattern area and then again for the border area. Size control of the contact holes is difficult because of the very small feature size. The sub-resolution contact holes cannot eliminate the light leakage problem completely especially when using a higher energy dose required for a larger depth-of-focus window.

U.S. Pat. No. 5,480,747 to Vasudev discloses a APSM using buried absorbers. U.S. Pat. No. 5,503,951 to Flanders et al describes a APSM with recessed attenuating regions. U.S. Pat. No. 5,565,386 to Lin teaches a APSM combined with an alternating-element PSM. U.S. Pat. No. 5,474,864 to Isoa et al discloses a PSM in which the transmittance is controlled by oxygen or nitrogen within the phase-shifting material.

SUMMARY OF THE INVENTION

Accordingly, it is a principal object of the present invention to provide an effective and very manufacturable process for fabricating an attenuated phase-shifting photomask.

Another object of the present invention is to provide a process of fabricating an attenuated phase-shifting photomask which completely resolves the light leakage problem at the border area.

Another object of the present invention is to provide a process of fabricating an attenuated phase-shifting photomask using a pattern of higher and lower dosage electron beam (E-beam) exposure.

In accordance with the objects of this invention a new process for fabricating an attenuated phase-shifting photomask is achieved. A photomask blank is provided comprising a phase-shifting layer overlying a substrate, a chromium layer overlying the phase-shifting layer, and a resist layer overlying the chromium layer. The resist layer of the photomask blank is exposed to electron-beam energy wherein a main pattern area of the photomask blank is exposed to a first dosage of the electron-beam energy and wherein a border area surrounding the main pattern area is not exposed to the electron-beam energy and wherein a secondary pattern area between the main pattern area and the border area is exposed to a second dosage of electron-beam energy wherein the second dosage is lower than the first dosage. The exposed resist layer is developed wherein the resist within the main pattern area is removed to expose the chromium layer. The exposed chromium layer is etched through to expose the underlying phase-shifting layer. The exposed phase-shifting layer is etched through to expose the substrate. The resist overlying the chromium layer within the secondary pattern area is etched away. The chromium layer within the secondary pattern area is etched away. The resist within the border area is stripped away to leave a patterned phase-shifting layer in the main pattern area and a chromium layer in the border area to complete fabrication of the attenuated phase-shifting photomask.

According to another object of the present invention, a new attenuating phase-shifting photomask having no light leakage in the border area is described. The attenuating phase-shifting photomask has a phase-shifting layer overlying a substrate wherein the phase-shifting layer includes a patterned area and a surrounding border area. A chromium layer overlies the border area of the phase-shifting layer wherein the chromium layer prevents light transmittance in the border area.

BRIEF DESCRIPTION OF THE DRAWINGS

In the accompanying drawings forming a material part of this description, there is shown.

DESCRIPTION OF THE PREFERRED EMBODIMENTS

Figure 3:
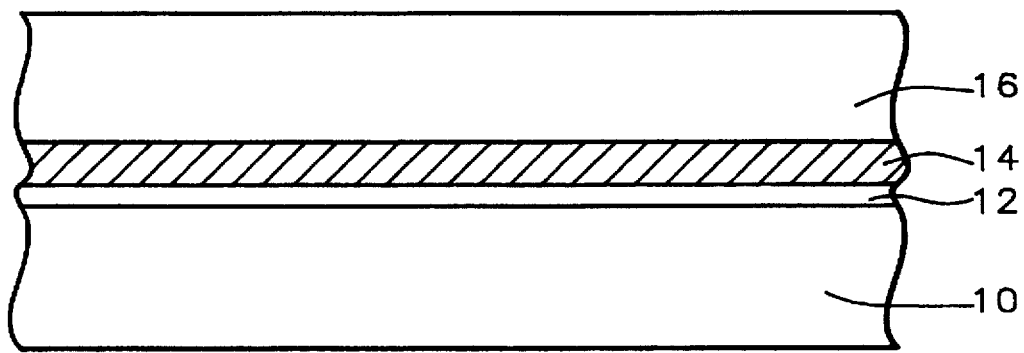
FIGS. 3 through 10 schematically illustrate in cross-sectional representation a preferred embodiment of the fabrication of an APSM of the present invention.

Referring now to FIG. 3, there is shown an illustration of a partially completed photomask. The substrate 10 is a quartz plate. A phase-shifting layer 12 of MoSiON or CrON has been deposited on the substrate 10 to a preferred thickness of between about 1000 and 1600 Angstroms. A layer 14 of chromium has been deposited overlying the phase-shifting layer 12 to a thickness of between about 950 and 1100 Angstroms. A layer of E-beam resist 16 is coated over the chromium layer. This completes the fabrication of the APSM blank.

Figures 1A, 1B:
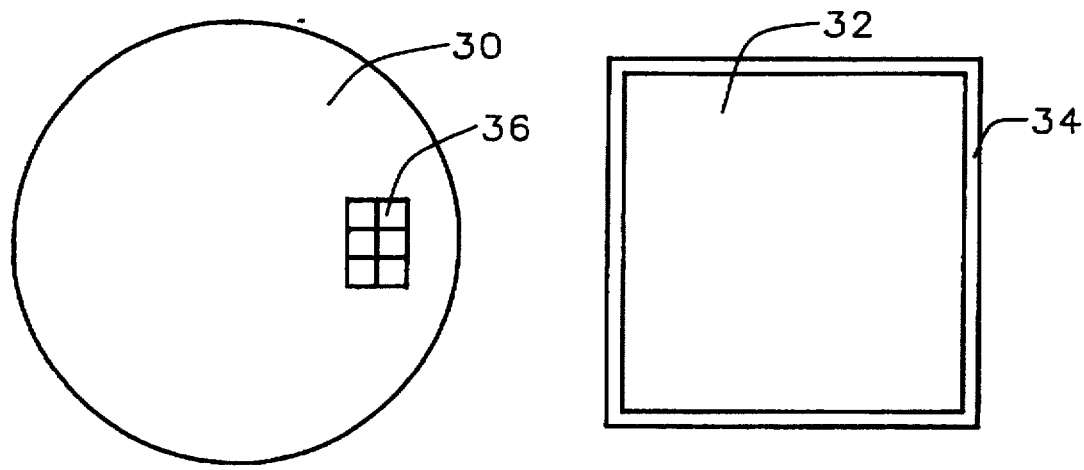
FIGS. 1A through 1C schematically illustrate the light leakage problem of the prior art.
Figure 1C:
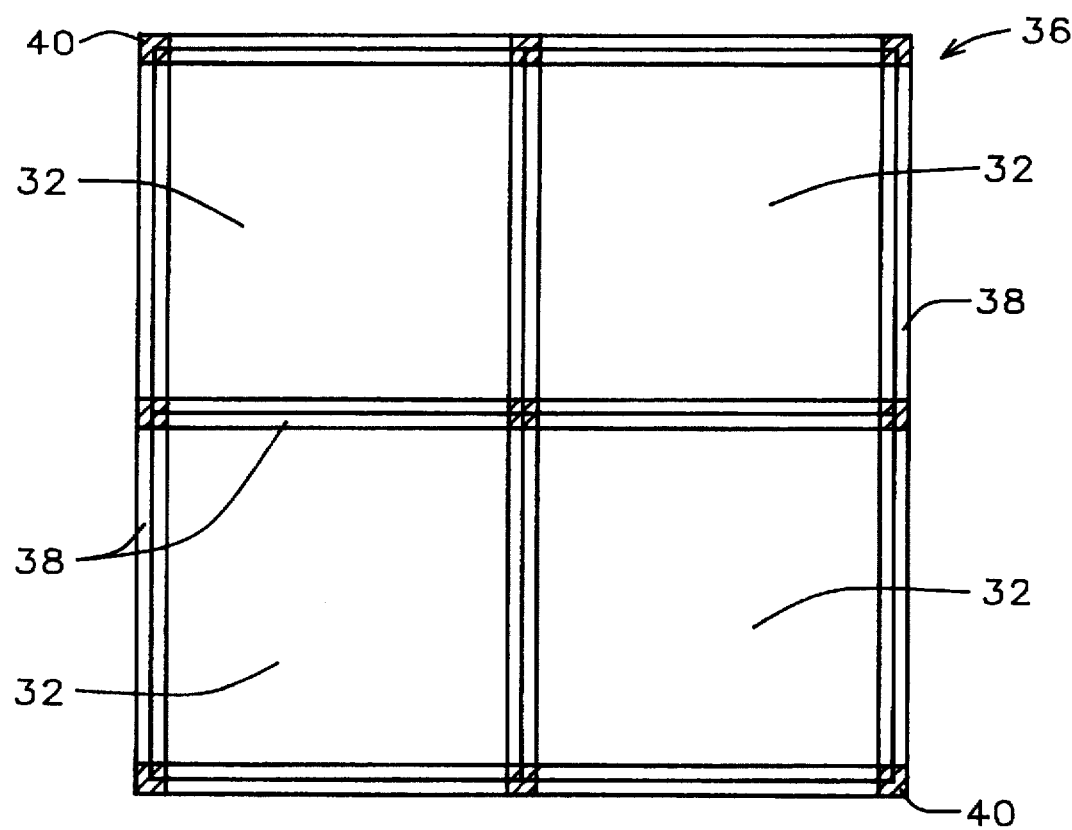
Figure 2:
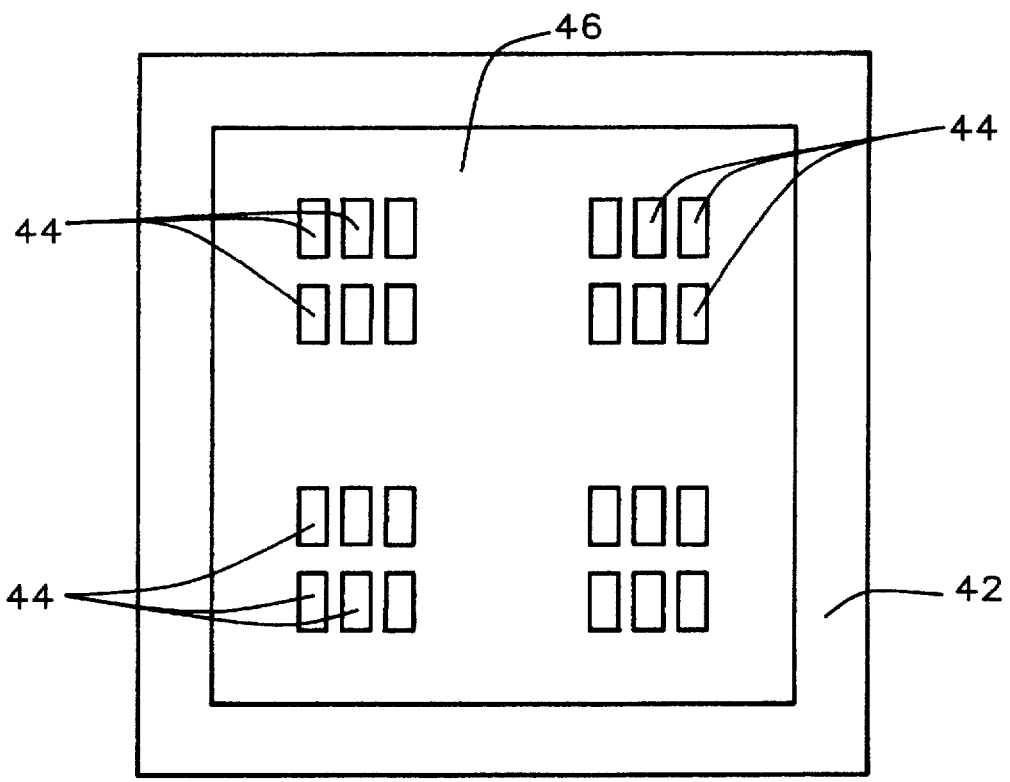
FIG. 2 schematically illustrates in top view the E-beam exposure pattern of the APSM blank.

The APSM blank is exposed to E-beam with different dosages, as shown in FIG. 2. The border area 42 is not exposed to E-beam. The main pattern areas 44 are exposed to a higher dosage while a lower dosage is used on the area 46 between the main pattern and the border area. The higher dosage is between about 7 to 11 $\mu c/cm^2$ and the lower dosage is between about 2 to 4 $\mu c/cm^2$.

Figure 4:
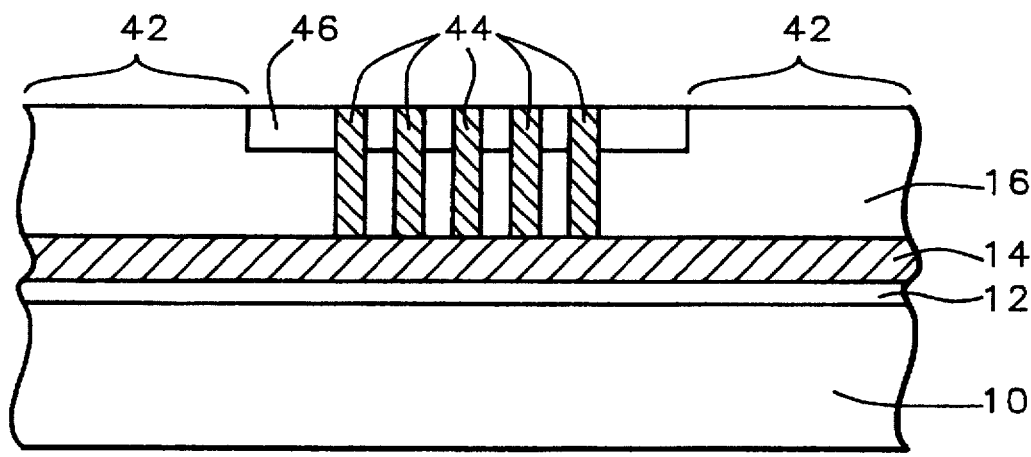

FIG. 4 illustrates the APSM after it has been exposed to the different E-beam dosages. The border area 42, having no exposure, the main pattern areas 44 having higher dosage exposure, and pattern area 46 having lower dosage exposure are illustrated.

Figure 5:
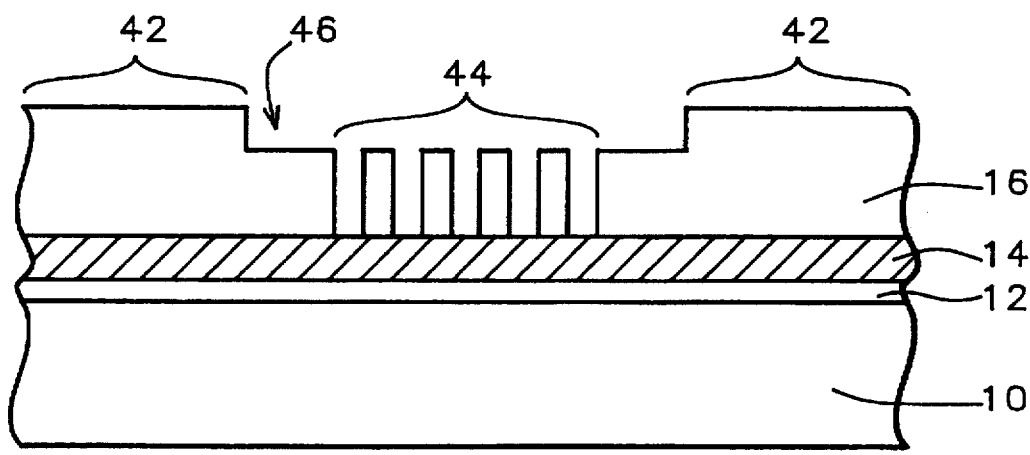
Figure 6:
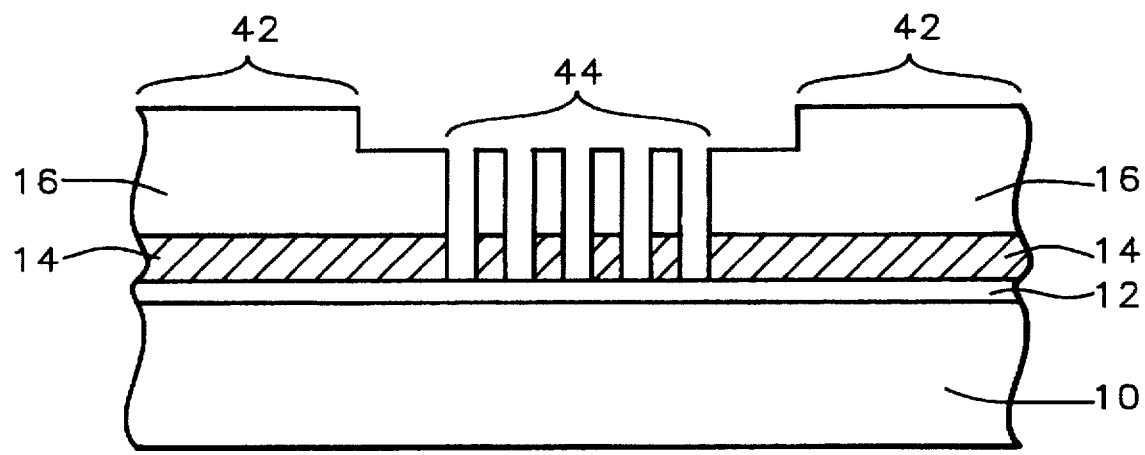
Figure 7:
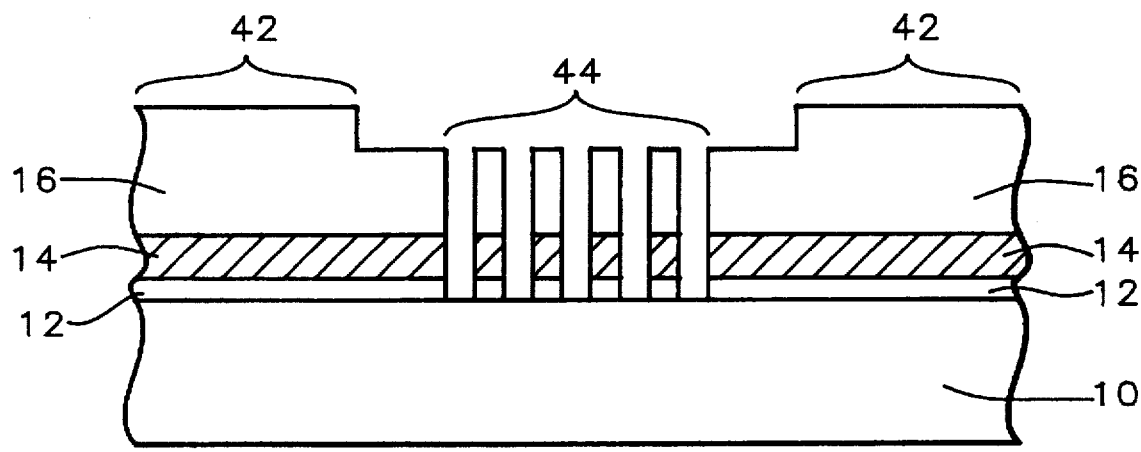

After wet development of the resist, different resist step heights have been created, as illustrated in FIG. 5. The main pattern is transferred to the chromium layer 14 by wet etching, as shown in FIG. 6. For example, the wet etching solution may be a mixture of $HClO_3$ and $(Ce(NH_4)_2(NO_3)_6)$. Referring to FIG. 7, the main pattern is now transferred to the phase-shifting layer 12 by dry etching, for example, using $CF_4$ and $O_2$.

Figure 8:
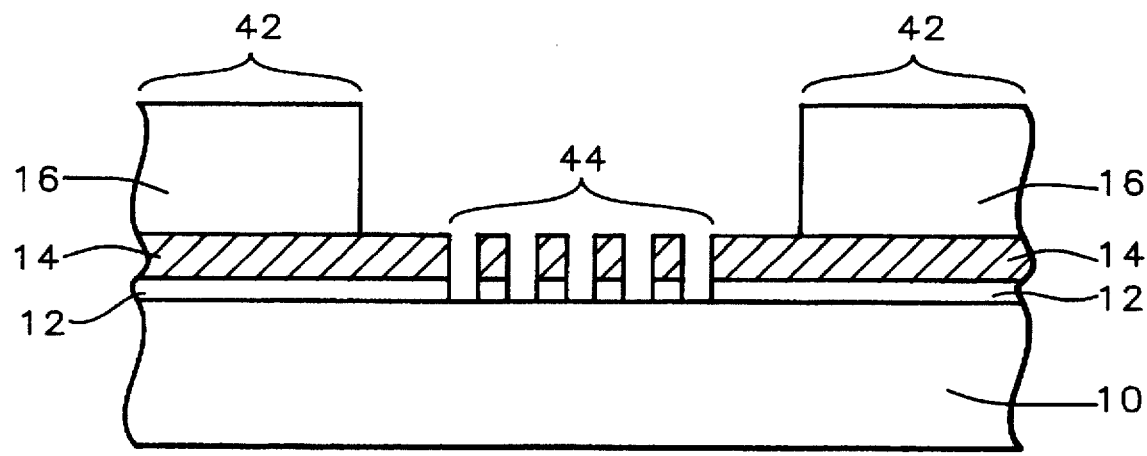

The exposed areas and non-exposed areas of resist have different thicknesses and structure. Therefore, an $O_2$ plasma dry etch having high selectivity and anisotrophy is used to remove the E-beam resist which was exposed to the lower energy dosage. That is, the etch selectivity of the exposed resist to the unexposed resist is about 2:1. FIG. 8 illustrates the results of this etching.

Figure 9:
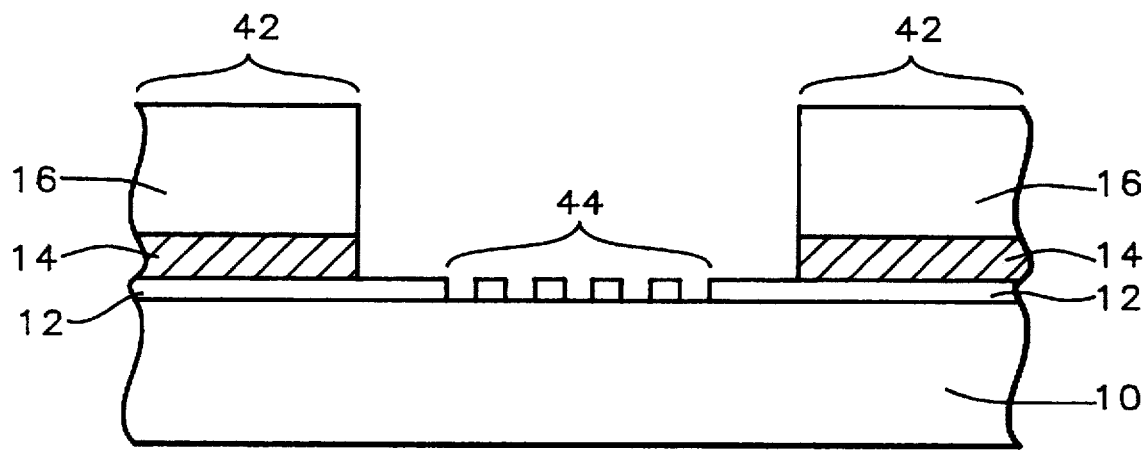
Figure 10:
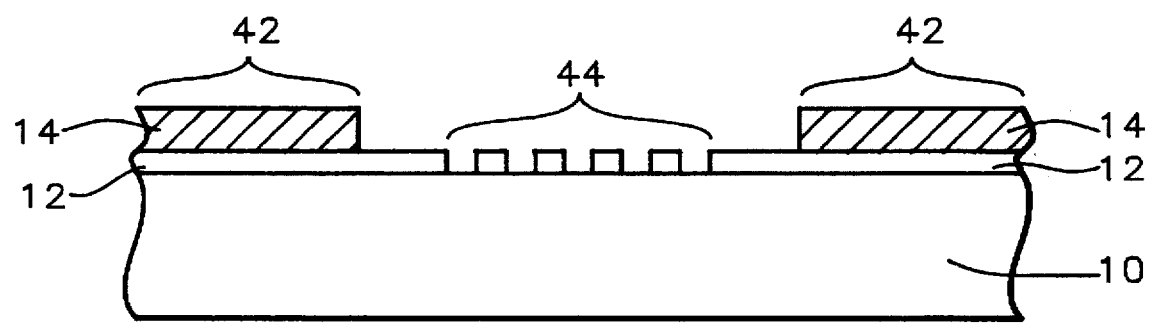

Referring now to FIG. 9, wet etching removes the chromium layer 14 in the main pattern area. The remaining resist 16 is stripped, as shown in FIG. 10. The chromium layer 14 is capped on the border area without any additional processing.

The attenuating phase shifter mask of the present invention is operative to light with defraction phenomena such as ultraviolet, deep ultraviolet, G-Line (436 nanometers), I-Line (365 nanometers) and the like.

EXAMPLE

The following Example is given to show the important features of the invention and to aid in the understanding thereof. Variations may be made by one skilled in the art without departing from the spirit and scope of the invention.

An attenuating phase shifter mask may be fabricated on a Hoya 6025 double layer MoSiON APSM blank comprising a quartz substrate having a thickness of 250 millimeters, a MoSiON film having a thickness of 1180 nanometers overlying the substrate, an oxide chrome and chrome film having a thickness of 100 nanometers overlying the MoSiON film, and a Structure ZEP E-beam resist of thickness 0.5 microns overall. The MoSiON film has a transmittance of 8% and a refractive index of 2.54 at i-line.

Other materials and thicknesses may be used in place of the blank in the example, as described above.

The process of the present invention provides an attenuated phase shifted mask using a simple process requiring a single E-beam exposure without a blind pattern. Since the transmittance of the chromium capping film on the border area is zero, there is no light transmittance at the border area. The process completely solves the light leakage problem from the border area.

FIG. 10 illustrates the attenuating phase-shifting photomask of the present invention having no light leakage in the border area. The attenuating phase-shifting photomask has a phase-shifting layer 12 overlying a substrate 10 wherein the phase-shifting layer 12 includes a patterned area 44 and a surrounding border area 42. A chromium layer 14 overlies the border area of the phase-shifting layer 12 wherein the chromium layer prevents light transmittance in the border area.

While the invention has been particularly shown and described with reference to the preferred embodiments thereof, it will be understood by those skilled in the art that various changes in form and details may be made without departing from the spirit and scope of the invention.

What is claimed is:

1. The method of fabricating an attenuating phase-shifting photomask comprising:

providing a photomask blank comprising a phase-shifting layer overlying a substrate, a chromium layer overlying said phase-shifting layer, and a resist layer overlying said chromium layer;

exposing said resist layer of said photomask blank to electron-beam energy in a single step wherein a main pattern area of said photomask blank is exposed to a first dosage of said electron-beam energy and wherein a border area surrounding said main pattern area is not exposed to said electron-bean energy and wherein a secondary pattern area between said main pattern area and said border area is exposed to a second dosage of said electron beam energy wherein said second dosage is lower than said first dosage;

developing said exposed resist layer wherein said resist within said main pattern area is removed to expose said chromium layer;

etching through said exposed chromium layer to expose underlying said phase-shifting layer;

etching through said exposed phase-shifting layer to expose said substrate;

etching away said resist overlying said chromium layer within said secondary pattern area;

etching away said chromium layer within said secondary pattern area; and stripping said resist within said border area to leave a patterned phase-shifting layer in said main pattern area and a chromium layer in said border area to complete fabrication of said attenuated phase-shifting photomask.

2. The method according to claim 1 wherein said substrate is quartz.

3. The method according to claim 1 wherein said phase-shifting layer comprises MoSiON and has a thickness of between about 1000 and 1600 Angstroms.

4. The method according to claim 1 wherein said phase-shifting layer comprises CrON and has a thickness of between about 1000 and 1600 Angstroms.

5. The method according to claim 1 wherein said chromium layer comprises chromium and chromium oxide.

6. The method according to claim 1 wherein said chromium layer has a thickness of between about 950 and 1100 Angstroms.

7. The method according to claim 1 wherein said first dosage is between about 7 and 11 µc/cm$^2$.

8. The method according to claim 1 wherein said second dosage is between about 2 and 4 µc/cm$^2$.

9. The method according to claim 1 wherein said chromium layer in said border area of said attenuated phase-shifting photomask prevents light transmittance in said border area thereby preventing the problem of light leakage in said border area.

10. The method of fabricating an attenuating phase-shifting photomask having no light leakage in its border area comprising:

provlding a photomask blank comprising a phase-shifting layer overlying a substrate, a chromium layer overlying said phase-shifting layer, and a resist layer overlying said chromium layer;

exposing said resist layer of said photomask blank to electron-beam energy in a single step wherein a main pattern area of said photomask blank is exposed to a first dosage of said electron-beam energy and wherein said border area surrounding said main pattern area is not exposed to said electron-beam energy and wherein a secondary pattern area between said main pattern area and said border area is exposed to a second dosage of said electron beam energy wherein said second dosage is lower than said first dosage;

developing said exposed resist layer wherein said resist within said main pattern area is removed to expose said chromium layer;

etching through said exposed chromium layer to expose underlying said phase-shifting layer;

etching through said exposed phase-shifting layer to expose said substrate;

etching away said resist overlying said chromium layer within said secondary pattern area;

etching away said chromium layer within said secondary pattern area; and stripping said resist within said border area to leave a patterned phase-shifting layer in said main pattern area and a chromium layer in said border area wherein said chromium layer in said border area of said attenuated phase-shifting photomask prevents light transmittance in said border area thereby preventing the problem of light leakage in said border area.

11. The method according to claim 10 wherein said substrate is quartz.

12. The method according to claim 10 wherein said phase-shifting layer comprises MoSiON and has a thickness of between about 1000 and 1600 Angstroms.

13. The method according to claim 10 wherein said phase-shifting layer comprises CrON and has a thickness of between about 1000 and 1600 Angstroms.

14. The method according to claim 10 wherein said chromium layer comprises chromium and chromium oxide.

15. The method according to claim 10 wherein said chromium layer has a thickness of between about 950 and 1100 Angstroms.

16. The method according to claim 10 wherein said first dosage is between about 7 and 11 µc/cm$^2$.

17. The method according to claim 10 wherein said second dosage is between about 2 and 4 µc/cm$^2$.

18. An attenuating phase-shifting photomask comprising:

a phase-shifting layer overlying a substrate wherein said phase-shifting layer includes a patterned area and a surrounding border area; and a chromium layer overlying said border area of said phase-shifting layer wherein said chromium layer prevents light transmittance in said border area.

19. The photomask according to claim 18 wherein said substrate is quartz.

20. The photomask according to claim 18 wherein said phase-shifting layer comprises MoSiON.

21. The photomask according to claim 18 wherein said phase-shifting layer comprises CrON.

22. The photomask according to claim 18 wherein said chromium layer comprises chromium and chromium oxide.

* * * * *